(12) United States Patent
Kim et al.

(10) Patent No.: US 12,272,775 B2
(45) Date of Patent: Apr. 8, 2025

(54) POLARIZED LIGHT EMITTING DEVICE AND POLARIZATION ANALYSIS APPARATUS

(71) Applicant: SAMSUNG ELECTRONICS CO., LTD., Suwon-si (KR)

(72) Inventors: Hyochul Kim, Yongin-si (KR); Yeonsang Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 874 days.

(21) Appl. No.: 17/466,791

(22) Filed: Sep. 3, 2021

(65) Prior Publication Data

US 2022/0077363 A1    Mar. 10, 2022

(30) Foreign Application Priority Data

Sep. 7, 2020 (KR) .................. 10-2020-0114073

(51) Int. Cl.
 *G02B 5/30* (2006.01)
 *G02B 27/28* (2006.01)
 *H01L 33/58* (2010.01)

(52) U.S. Cl.
 CPC ............ *H01L 33/58* (2013.01); *G02B 5/3025* (2013.01); *G02B 5/3083* (2013.01); *G02B 27/28* (2013.01)

(58) Field of Classification Search
 CPC ...... G02B 6/0055; G02B 5/203; G02B 5/201; G02B 5/20; G02B 27/228; G02B 27/285;

(Continued)

(56) References Cited

U.S. PATENT DOCUMENTS

2007/0165308 A1   7/2007  Wang et al.
2010/0098126 A1*  4/2010  Singer ............... H01S 3/0627
                                                    264/1.7

(Continued)

FOREIGN PATENT DOCUMENTS

EP      3 546 903 A2      10/2019
KR   10-2021-0061045 A     5/2021
KR   10-2021-0079824 A     6/2021

OTHER PUBLICATIONS

Luis Cerdan et al., "Circularly polarized laser emission in optically active organic dye solutions", Phys. Chem. Chem. Phys., Jul. 26, 2017. (8 pages total).

(Continued)

*Primary Examiner* — Sharrief I Broome
*Assistant Examiner* — Journey F Sumlar
(74) *Attorney, Agent, or Firm* — Sughrue Mion, PLLC

(57) ABSTRACT

A polarized light emitting device and a polarization analysis apparatus including the same are disclosed. The polarized light emitting device includes a first reflective layer and a second reflective layer disposed to face each other in a first direction, a gain medium layer between the first reflective layer and the second reflective layer, and a linear polarizer layer, wherein the linear polarizer layer includes a plurality of first grating elements alternately arranged with a plurality of second grating elements along a second direction perpendicular to the first direction, wherein each of the first grating elements includes a first dielectric material having a first refractive index, and wherein each of the second grating elements includes a second dielectric material having a second refractive index different from the first refractive index.

12 Claims, 10 Drawing Sheets

(58) Field of Classification Search
CPC .. G02B 27/28; G02B 5/3083; G02B 5/33058; G02B 5/3041; G02B 5/3008; G02B 5/30; G02B 5/3025; G02B 5/286; G02B 5/288
See application file for complete search history.

(56) References Cited

U.S. PATENT DOCUMENTS

| | | |
|---|---|---|
| 2015/0124306 A1 | 5/2015 | Bartoli et al. |
| 2016/0116754 A1 | 4/2016 | Wang |
| 2017/0115497 A1* | 4/2017 | Chen .................. H04N 13/207 |
| 2018/0156949 A1 | 6/2018 | Tsai et al. |
| 2019/0064532 A1 | 2/2019 | Riley, Jr. et al. |
| 2019/0277693 A1 | 9/2019 | Kim et al. |
| 2020/0073029 A1 | 3/2020 | Han et al. |
| 2020/0076163 A1 | 3/2020 | Han et al. |
| 2020/0158641 A1* | 5/2020 | Fan .................. G02B 21/0096 |
| 2021/0148755 A1 | 5/2021 | Lee et al. |
| 2021/0148757 A1 | 5/2021 | Kim et al. |
| 2021/0191141 A1 | 6/2021 | Park et al. |

OTHER PUBLICATIONS

R. Fiederling et al., "Injection and detection of a spin-polarized current in a light-emitting diode", Nature, Dec. 16, 1999, vol. 402, pp. 787-790.

Zhongyi Guo et al., "Dielectric metasurface based high-efficiency polarization splitters", RSC Advances, Feb. 3, 2017, vol. 7, pp. 9872-9879.

Huan Jiang et al., "All-dielectric circular polarizer with nearly unit transmission efficiency based on cascaded tensor Huygens surface", Optics Express, Aug. 8, 2016, vol. 24, No. 16, pp. 17738-17745.

Yilin Wang et al., "Ultra-compact visible light depolarizer based on dielectric metasurface", Applied Physics Letters, Feb. 4, 2020, vol. 116. (5 pages total).

Jochen R. Brandt et al., "Circularly Polarized Phosporescent Electoluminescence with a High Dissymmetry Factor from PHOLEDs Based on a Platinahelicene", J. Am. Chem. Soc., Jul. 19, 2016, vol. 138, pp. 9743-9746.

Fei Chen et al., "Tunable circularly polarized lasing emission in reflection distributed feedback dye lasers", Optics Express, Oct. 13, 2008, vol. 16, No. 21, pp. 16746-16753.

Luis Cerdan et al., "Circularly polarized laser emission induced in isotropic and achiral dye systems", Scientific Reports, Jun. 28, 2016, vol. 6, No. 28740. (9 pages total).

\* cited by examiner

POLARIZED LIGHT EMITTING DEVICE AND POLARIZATION ANALYSIS APPARATUS

CROSS-REFERENCE TO RELATED APPLICATION

This application is based on and claims priority under 35 U.S.C. § 119 to Korean Patent Application No. 10-2020-0114073, filed on Sep. 7, 2020, in the Korean Intellectual Property Office, the disclosure of which is incorporated by reference herein in its entirety.

BACKGROUND

1. Field

The disclosure relates to a polarized light emitting device and a polarization analysis apparatus including the same, and more particularly, to a micro-light emitting device capable of emitting light of various polarization components and a polarization analysis apparatus including the same.

2. Description of Related Art

Many molecular structures in nature have chiral symmetry. Materials having chiral symmetry show various response characteristics to light having a circularly polarized light component. Therefore, the importance of circularly polarized light sources has increased in researching new materials or biological materials. In addition, various information such as pressure, surface defects, scratches, and the like in fields such as industrial equipment and automotive electronic parts can be obtained using a circularly polarized light source.

SUMMARY

In accordance with an aspect of the disclosure, a polarized light emitting device includes a first reflective layer and a second reflective layer disposed to face each other in a first direction; a gain medium layer between the first reflective layer and the second reflective layer, the gain medium layer being configured to generate light; a first electrode electrically connected to an upper surface of the gain medium layer; a second electrode electrically connected to a lower surface of the gain medium layer; and a linear polarizer layer between the first reflective layer and the first electrode, wherein the linear polarizer layer includes a plurality of first grating elements alternately arranged with a plurality of second grating elements along a second direction perpendicular to the first direction, wherein each first grating element of the plurality of first grating elements includes a first dielectric material having a first refractive index, and each second grating element of the plurality of second grating elements includes a second dielectric material having a second refractive index different from the first refractive index.

Each first grating element of the plurality of first grating elements and each second grating element of the plurality of second grating elements may have a rod shape, and the plurality of first grating elements and the plurality of second grating elements may be arranged one-dimensionally.

A first surface of the plurality of first grating elements and a first surface of the plurality of second grating elements may contact the first reflective layer, and a second surface of the first grating element opposite the first surface of the plurality of first grating elements and a second surface of the second grating element opposite the first surface of the plurality of second grating elements may contact the first electrode.

A thickness of each first grating element of the plurality of first grating elements and each second grating element of the plurality of second grating elements may be about 90 nm to about 350 nm.

An arrangement period of the plurality of first grating elements and the plurality of second grating elements may be about 150 nm to about 300 nm.

Each first grating element of the plurality of first grating elements may have a first width in the second direction and each second grating element of the plurality of second grating elements may have a second width in the second direction, and a ratio of the first width to the second width may be about 0.2 to about 0.7.

The first electrode and the second electrode may include a transparent conductive material so that light generated from the gain medium layer passes through the first electrode and the second electrode.

The first dielectric material and the second dielectric material may include a material transparent to light generated by the gain medium layer.

The polarized light emitting device may further include a polarization conversion layer disposed on a light emitting surface of the second reflective layer, the polarization conversion layer being configured to convert a polarization state of incident light by delaying a phase of the incident light.

The polarization conversion layer may include a grating structure patterned with a nanoscale pattern smaller than a wavelength of the light generated from the gain medium layer.

The polarization conversion layer may include a first polarization conversion layer delaying the phase of the incident light by ¼ wavelength; and a second polarization conversion layer delaying the phase of the incident light by ¾ wavelength.

The first polarization conversion layer may be configured to change a traveling direction of the incident light into a first traveling direction and the second polarization conversion layer may be configured to change the traveling direction of the incident light into a second traveling direction different from the first traveling direction.

In accordance with an aspect of the disclosure, a polarized light emitting device includes a first reflective layer; a first electrode disposed on the first reflective layer; a gain medium layer disposed on the first electrode and configured to generate light; a second electrode disposed on the gain medium layer; a reflective polarizer layer disposed on the second electrode; and a polarization conversion layer disposed on the reflective polarizer layer, the polarization conversion layer being configured to convert a polarization state of incident light by delaying a phase of the incident light.

The reflective polarizer layer may face the first reflective layer in a first direction, the reflective polarizer layer may include a plurality of first grating elements alternately arranged with a plurality of second grating elements along a second direction perpendicular to the first direction so as to have high reflectance for light having a linearly polarized component in a predetermined direction, each first grating element of the plurality of first grating elements may include a first dielectric material having a first refractive index, and each second grating element of the plurality of second grating elements may include a second dielectric material having a second refractive index different from the first refractive index.

In accordance with an aspect of the disclosure, a light emitting device array includes six polarized light emitting devices, four polarized light emitting devices of the six polarized light emitting devices being configured to emit light including a linearly polarized component and two polarized light emitting devices of the six polarized light emitting devices being configured to emit light including a circularly polarized component, wherein each polarized light emitting device of the six polarized light emitting devices includes a first reflective layer and a second reflective layer disposed to face each other in a first direction; a gain medium layer between the first reflective layer and the second reflective layer, the gain medium layer being configured to generate light; a first electrode electrically connected to an upper surface of the gain medium layer; a second electrode electrically connected to a lower surface of the gain medium layer; and a linear polarizer layer between the first reflective layer and the first electrode, wherein the linear polarizer layer includes a plurality of first grating elements alternately arranged with a plurality of second grating elements along a second direction perpendicular to the first direction, wherein each first grating element of the plurality of first grating elements includes a first dielectric material having a first refractive index, wherein each second grating element of the plurality of second grating elements includes a second dielectric material having a second refractive index different from the first refractive index, and wherein each polarized light emitting device of the two polarized light emitting devices further includes a polarization conversion layer disposed on a light emitting surface of the second reflective layer, the polarization conversion layer being configured to convert a polarization state of incident light by delaying a phase of the incident light.

A first polarized light emitting device of the four polarized light emitting devices may be configured to emit light including a first linearly polarized component, a second polarized light emitting device of the four polarized light emitting devices may be configured to emit light including a second linearly polarized component inclined at 45 degrees with respect to the first linearly polarized component, a third polarized light emitting device of the four polarized light emitting devices may be configured to emit light including a third linearly polarized component perpendicular to the first linearly polarized component, a fourth polarized light emitting device of the four polarized light emitting devices may be configured to emit light including a fourth linearly polarized component inclined at 135 degrees with respect to the first linearly polarized component, a fifth polarized light emitting device of the two polarized light emitting devices may be configured to emit light including a first circularly polarized light component, and a sixth polarized light emitting device of the two polarized light emitting devices may be configured to emit light including a second circularly polarized component rotated in a direction opposite to the first circularly polarized component.

In accordance with an aspect of the disclosure, a polarization analysis apparatus includes a light emitting device array; and a polarization sensor including an image sensor and a polarization filter array, the polarization filter array being disposed on the image sensor, wherein the light emitting device array includes six polarized light emitting devices, four polarized light emitting devices of the six polarized light emitting devices being configured to emit light including a linearly polarized component and two polarized light emitting devices of the six polarized light emitting devices being configured to emit light including a circularly polarized component, wherein each polarized light emitting device of the six polarized light emitting devices includes a first reflective layer and a second reflective layer disposed to face each other in a first direction; a gain medium layer between the first reflective layer and the second reflective layer, the gain medium layer being configured to generate light; a first electrode electrically connected to an upper surface of the gain medium layer; a second electrode electrically connected to a lower surface of the gain medium layer; and a linear polarizer layer between the first reflective layer and the first electrode, wherein the linear polarizer layer includes a plurality of first grating elements alternately arranged with a plurality of second grating elements along a second direction perpendicular to the first direction, wherein each first grating element of the plurality of first grating elements includes a first dielectric material having a first refractive index, wherein each second grating element of the plurality of second grating elements includes a second dielectric material having a second refractive index different from the first refractive index, and wherein each polarized light emitting device of the two polarized light emitting devices further includes a polarization conversion layer disposed on a light emitting surface of the second reflective layer, the polarization conversion layer being configured to convert a polarization state of incident light by delaying a phase of the incident light.

In accordance with an aspect of the disclosure, a polarization spectral analysis apparatus includes a plurality of light emitting device arrays; and a plurality of polarization sensors, each polarization sensor of the plurality of polarization sensors including an image sensor and a polarization filter array disposed on the image sensor, wherein each light emitting device array of the plurality of light emitting device arrays is configured to emit light of a wavelength different from wavelengths of light emitted by each other light emitting device array of the plurality of light emitting device arrays, and wherein each polarization sensor of the plurality of polarization sensors is configured to detect light of a wavelength different from wavelengths of light detected by each other polarization sensor of the plurality of polarization sensors, wherein each light emitting device array of the plurality of light emitting device arrays includes six polarized light emitting devices, four polarized light emitting devices of the six polarized light emitting devices being configured to emit light including a linearly polarized component and two polarized light emitting devices of the six polarized light emitting devices being configured to emit light including a circularly polarized component, wherein each polarized light emitting device of the six polarized light emitting devices includes a first reflective layer and a second reflective layer disposed to face each other in a first direction; a gain medium layer between the first reflective layer and the second reflective layer, the gain medium layer being configured to generate light; a first electrode electrically connected to an upper surface of the gain medium layer; a second electrode electrically connected to a lower surface of the gain medium layer; and a linear polarizer layer between the first reflective layer and the first electrode, wherein the linear polarizer layer includes a plurality of first grating elements alternately arranged with a plurality of second grating elements along a second direction perpendicular to the first direction, wherein each first grating element of the plurality of first grating elements includes a first dielectric material having a first refractive index, wherein each second grating element of the plurality of second grating elements includes a second dielectric material having a second refractive index different from the first refractive index, and wherein each polarized light emitting device of the two polarized light emitting devices further includes a polarization conversion layer disposed on a light emitting surface of the second reflective layer, the polarization conversion layer being configured to convert a polarization state of incident light by delaying a phase of the incident light.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
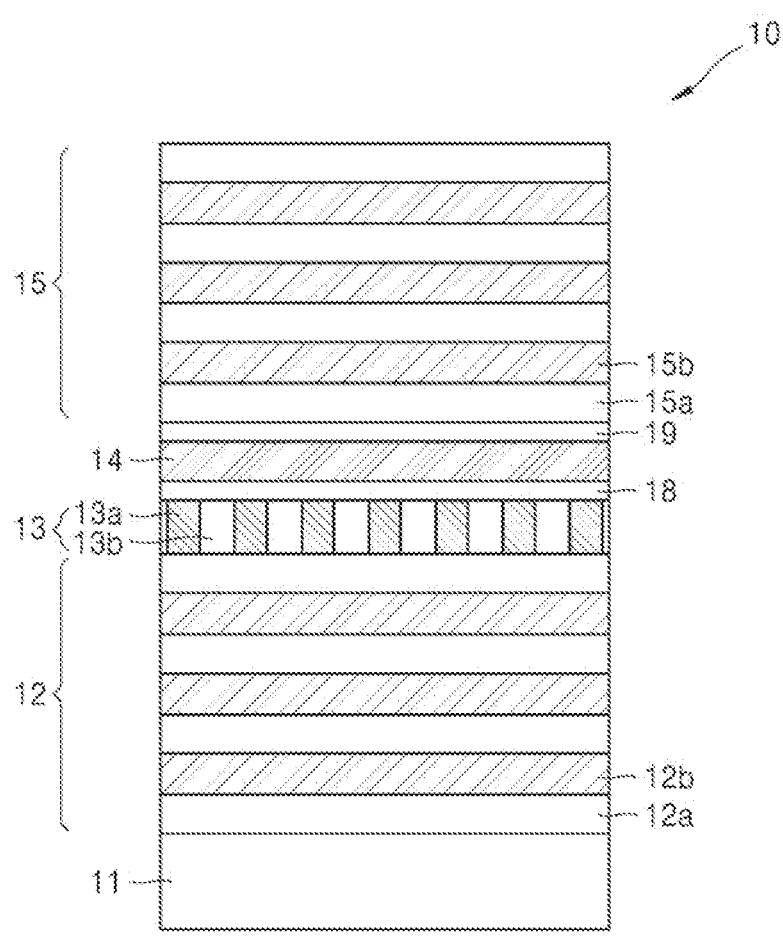
FIG. 1 is a schematic cross-sectional view of a configuration of a polarized light emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a polarized light emitting device and a polarization analysis apparatus including the same will be described in detail with reference to the accompanying drawings. In the following drawings, the same reference numerals refer to the same components, and the size of each component in the drawings may be exaggerated for clarity and convenience of description. Further, embodiments described below are merely examples, and various modifications are possible from these embodiments.

Hereinafter, what is described as "upper part" or "on" may include not only those directly above by contact, but also those above by non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIG. 1 is a schematic cross-sectional view of a configuration of a polarized light emitting device according to an embodiment. Referring to FIG. 1, a polarized light emitting device 10 may include a substrate 11, a first reflective layer 12 disposed on the substrate 11, a linear polarizer layer 13 disposed on the first reflective layer 12, a gain medium layer 14 disposed on the linear polarizer layer 13, and a second reflective layer 15 disposed on the gain medium layer 14. The first reflective layer 12 and the second reflective layer 15 are disposed to face each other along the thickness direction of the polarized light emitting device 10 (e.g., the vertical direction as shown in FIG. 1), and the linear polarizer layer 13 and the gain medium layer 14 are disposed between the first reflective layer 12 and the second reflective layer 15. In addition, the polarized light emitting device 10 may further include a first electrode 18 arranged to be electrically connected to the lower surface of the gain medium layer 14 and a second electrode 19 arranged to be electrically connected to the upper surface of the gain medium layer 14.

The gain medium layer 14 may have a quantum well structure in which quantum wells are disposed between barriers. For example, the gain medium layer 14 may have a multi-quantum well (MQW) structure in which a plurality of quantum wells and a plurality of barriers are alternately arranged. Light may be generated as electrons and holes recombine in the quantum well in the gain medium layer 14. The wavelength of light generated from the gain medium layer 14 may be determined according to the band gap of the semiconductor material constituting the quantum well in the gain medium layer 14. The semiconductor material of the gain medium layer 14 may include, for example, silicon (Si), germanium (Ge), a II-VI group compound semiconductor, or a III-V group compound semiconductor.

A first electrode 18 and a second electrode 19 supplying current to the gain medium layer 14 may be disposed on the lower and upper surfaces of the gain medium layer 14, respectively. The first electrode 18 and the second electrode 19 may be disposed to directly contact the lower and upper surfaces of the gain medium layer 14, respectively. As another example, a contact layer that forms an ohmic contact between the gain medium layer 14 and the first electrode 18 and a contact layer that forms an ohmic contact between the gain medium layer 14 and the second electrode 19 may be further included. In addition, the gain medium layer 14 may further include an n-doped semiconductor layer supplying electrons to the quantum well and a p-doped semiconductor layer supplying holes to the quantum well.

The first electrode 18 and the second electrode 19 are disposed between the first reflective layer 12 and the second reflective layer 15. Therefore, the first electrode 18 and the second electrode 19 may be made of a transparent conductive material so that light generated from the gain medium layer 14 can be transmitted. For example, the first electrode 18 and the second electrode 19 may include ITO, IZO, ZnO, or the like.

The first reflective layer 12 and the second reflective layer 15 may be, for example, Distributed Bragg reflectors (DBRs) formed by repeatedly alternately stacking two dielectric layers having different refractive indices. For example, the first reflective layer 12 may include a plurality of first dielectric layers 12a and a plurality of second dielectric layers 12b alternately stacked along the thickness direction of the polarized light emitting device 10. The second reflective layer 15 may include a plurality of third dielectric layers 15a and a plurality of fourth dielectric layers 15b alternately stacked along the thickness direction of the polarized light emitting device 10. The first dielectric layer 12a and the second dielectric layer 12b may be made of dielectric materials having different refractive indices. Also, the third dielectric layer 15a and the fourth dielectric layer 15b may be made of dielectric materials having different refractive indices.

For example, the first dielectric layer 12a and the second dielectric layer 12b may be made of two different dielectric materials selected from Si, $TiO_2$, $SiO_2$, and $Si_3N_4$, and the third dielectric layer 15a and the fourth dielectric layer 15b may also be made of two different dielectric materials selected from Si, $TiO_2$, $SiO_2$, and $Si_3N_4$. In addition, the first dielectric layer 12a of the first reflective layer 12 and the third dielectric layer 15a of the second reflective layer 15 may be made of the same dielectric material, and the second dielectric layer 12b of the first reflective layer 12 and the fourth dielectric layer 15b of the second reflective layer 15 may be made of the same dielectric material. As another example, the first dielectric layer 12a of the first reflective layer 12 and the fourth dielectric layer 15b of the second reflective layer 15 may be made of the same dielectric material, and the second dielectric layer 12b of the first reflective layer 12 and the third dielectric layer 15a of the second reflective layer 15 may be made of the same dielectric material.

According to the structure of the first reflective layer 12 and the second reflective layer 15, reflection occurs at the interface between the first dielectric layer 12a and the second dielectric layer 12b having different refractive indices and the interface between the third dielectric layer 15a and the fourth dielectric layer 15b, so that high reflectivity can be obtained by matching the phases of all the reflected lights. For this reason, the optical thickness (i.e., the physical thickness multiplied by the refractive index of the layer material) of each of the first to fourth dielectric layers 12a, 12b, 15a, and 15b may be selected to be approximately ¼ of the wavelength band of light emitted from the polarized light emitting device 10.

The first reflective layer 12 and the second reflective layer 15 disposed to face each other form a resonator for resonating light. A gain medium layer 14 and a linear polarizer layer 13 are disposed in the resonator formed by the first reflective layer 12 and the second reflective layer 15. Light generated in the gain medium layer 14 may be emitted through the upper surface of the second reflective layer 15 while resonating between the first reflective layer 12 and the second reflective layer 15. For this reason, the first reflective layer 12 may be formed to have a reflectivity of 90% or more, and the second reflective layer 15 may be formed to have a reflectivity of about 50%. In addition, the first reflective layer 12 and the second reflective layer 15 may be formed so that the resonance wavelength of the resonator formed between the first reflective layer 12 and the second reflective layer 15 matches the wavelength of light generated from the gain medium layer 14.

While resonating between the first reflective layer 12 and the second reflective layer 15, the light repeatedly passes through the linear polarizer layer 13. Accordingly, the characteristics of light emitted through the upper surface of the second reflective layer 15 may also be determined by the structure of the linear polarizer layer 13. In an embodiment, the linear polarizer layer 13 may be formed in a meta structure having polarization dependent properties. For this reason, the linear polarizer layer 13 may include a plurality of first grating elements 13a and a plurality of second grating elements 13b alternately arranged in a horizontal direction perpendicular to the thickness direction of the polarized light emitting device 10 (e.g., the horizontal direction as shown in FIG. 1). For example, the plurality of first grating elements 13a and the plurality of second grating elements 13b may be arranged such that the lower surfaces of the plurality of first grating elements 13a and the lower surfaces of the plurality of second grating elements 13b each contact the first reflective layer 12 and are located on the same plane as each other, and the upper surfaces of the plurality of first grating elements 13a and the upper surfaces of the plurality of second grating elements 13b each contact the first electrode 18 and are located on the same plane as each other.

In FIG. 1, the linear polarizer layer 13 is shown to be disposed between the first reflective layer 12 and the first electrode 18, but is not limited thereto. Instead, the linear polarizer layer 13 may be disposed between the second electrode 19 and the second reflective layer 15. In this case, the plurality of first grating elements 13a and the plurality of second grating elements 13b may be arranged such that the lower surfaces of the plurality of first grating elements 13a and the lower surfaces of the plurality of second grating elements 13b each contact the second electrode 19 and are located on the same plane as each other, and the upper surfaces of the plurality of first grating elements 13a and the upper surfaces of the plurality of second grating elements 13b each contact the second reflective layer 15 and are located on the same plane as each other.

The first grating element 13a and the second grating element 13b may be made of dielectric materials having different refractive indices. In other words, each of the first grating elements 13a may be made of a first dielectric material having a first refractive index, and each second grating element 13*b* may be made of a second dielectric material having a second refractive index different from the first refractive index. In addition, the first dielectric material and the second dielectric material may be transparent to light generated by the gain medium layer 14. For example, the first grating element 13*a* and the second grating element 13*b* may be made of two different dielectric materials selected from Si, $TiO_2$, $SiO_2$, and $Si_2N_3$. In addition to the example materials above, the first dielectric material and the second dielectric material constituting the first grating element 13*a* and the second grating element 13*b* may include any other material that is transparent to light in the emission wavelength band of the polarized light emitting device 10.

In addition, the first grating element 13*a* may be made of the same dielectric material as the first dielectric layer 12*a* of the first reflective layer 12 and the third dielectric layer 15*a* of the second reflective layer 15, and the second grating element 13*b* may be made of the same dielectric material as the second dielectric layer 12*b* of the first reflective layer 12 and the fourth dielectric layer 15*b* of the second reflective layer 15. As another example, the first grating element 13*a* may be made of the same dielectric material as the first dielectric layer 12*a* of the first reflective layer 12 and the fourth dielectric layer 15*b* of the second reflective layer 15, and the second grating element 13*b* may be made of the same dielectric material as the second dielectric layer 12*b* of the first reflective layer 12 and the third dielectric layer 15*a* of the second reflective layer 15.

Figure 2:
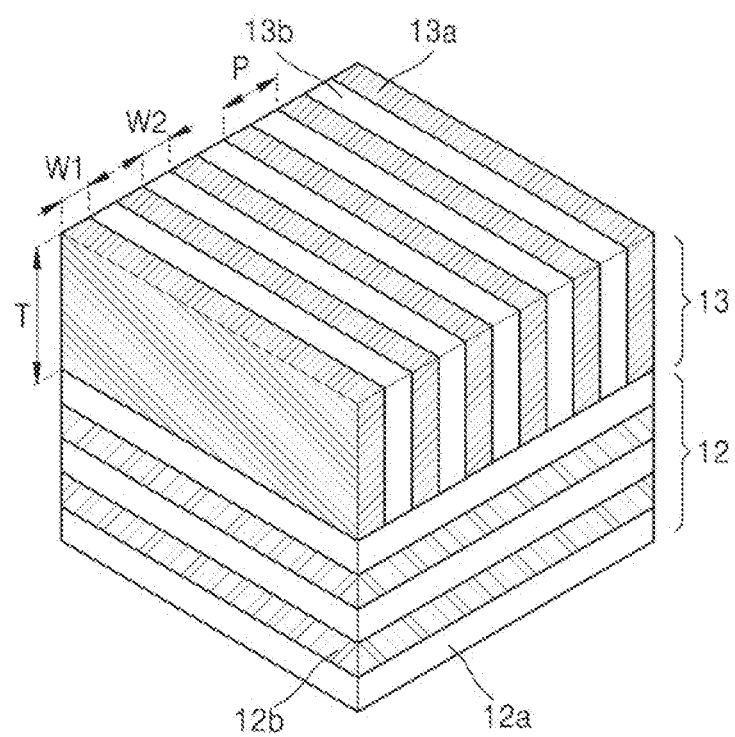
FIG. 2 is a perspective view schematically showing the configuration of the linear polarizer layer shown in FIG. 1 according to an embodiment.

FIG. 2 is a perspective view schematically showing the configuration of the linear polarizer layer 13 shown in FIG. 1. Referring to FIG. 2, each first grating element 13*a* and each second grating element 13*b* of the linear polarizer layer 13 may have a shape of a rod extending in one direction. Further, a plurality of first grating elements 13*a* and a plurality of second grating elements 13*b* are alternately arranged repeatedly along the width direction of the linear polarizer layer 13. The first grating element 13*a* and the second grating element 13*b* have the same thickness T as shown in FIG. 2. Further, the plurality of first grating elements 13*a* each have the same width W1 and the plurality of second grating elements 13*b* each have the same width W2. Accordingly, the plurality of first grating elements 13*a* and the plurality of second grating elements 13*b* are arranged in a constant period P.

Since the plurality of first grating elements 13*a* and the plurality of second grating elements 13*b* are one-dimensionally arranged in the above-described manner, the linear polarizer layer 13 and the polarized light emitting device 10 may have linear polarization characteristics. For example, among the light resonating between the first reflective layer 12 and the second reflective layer 15, the transmittance of the linear polarizer layer 13 for light having a polarization component parallel to the length direction of the first grating element 13*a* and the second grating element 13*b* and the transmittance of the linear polarizer layer 13 for light having a polarization component perpendicular to the length direction of the first grating element 13*a* and the second grating element 13*b* may be different from each other.

The polarization characteristics of the linear polarizer layer 13 may be determined by the thickness T of each of the first grating element 13*a* and the second grating element 13*b*, the arrangement period P of the first grating element 13*a* and the second grating element 13*b*, and a ratio between widths of the first grating element 13*a* and the second grating element 13*b*. For example, the thicknesses of each of the first grating elements 13*a* and each of the second grating elements 13*b* may range from about 90 nm to about 350 nm. In addition, the arrangement period P of the plurality of first grating elements 13*a* and the plurality of second grating elements 13*b* may range from 150 nm to 300 nm.

Accordingly, a dimension of each of the first grating elements 13*a* and each of the second grating elements 13*b* may be smaller than the transmission wavelength of the linear polarizer layer 13. For example, the thickness of each of the first grating elements 13*a* and each of the second grating elements 13*b* may be less than ½ or ⅓ of the transmission wavelength of the linear polarizer layer 13. In addition, the arrangement period P of the plurality of first grating elements 13*a* and the plurality of second grating elements 13*b* may be less than ½ or ⅓ of the transmission wavelength of the linear polarizer layer 13.

Since the first grating element 13*a* and the second grating element 13*b* have the same thickness, the ratio of the first grating element 13*a* and the second grating element 13*b* is the same as the ratio of the width W1 of the first grating element 13*a* and the width W2 of the second grating element 13*b*. For example, when the first refractive index of the first dielectric material constituting the first grating element 13*a* is lower than the second refractive index of the second dielectric material constituting the second grating element 13*b*, the ratio W1/W2 of the first grating element 13*a* to the second grating element 13*b* may range from about 0.2 to about 0.7. The thickness T of the first grating element 13*a* and the second grating element 13*b* and the arrangement period P of the plurality of first grating elements 13*a* and the plurality of second grating elements 13*b* are fixed and the polarization characteristics of the linear polarizer layer 13 can be adjusted just by adjusting the ratio (W1/W2) of the first grating element 13*a* to the second grating element 13*b*.

The linear polarizer layer 13 has been described as including only the first grating element 13*a* and the second grating element 13*b*, but is not limited thereto. The linear polarizer layer 13 may be configured by alternately arranging three or four or more grating elements having different refractive indices from each other.

Figure 3:
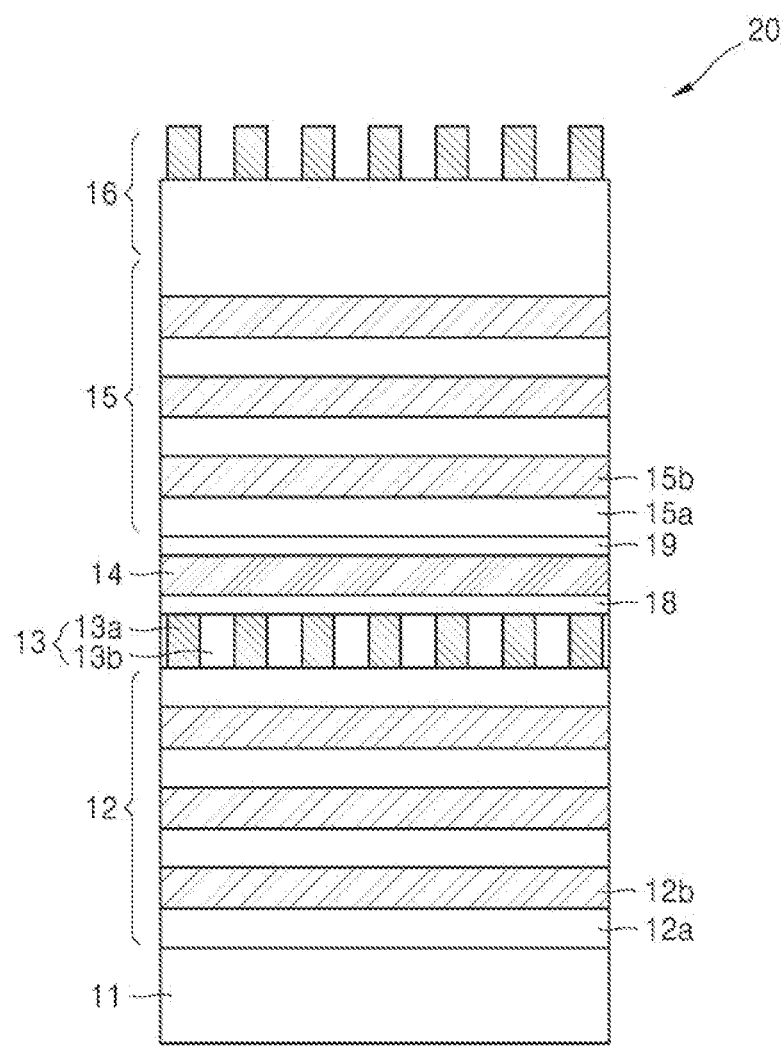
FIG. 3 is a schematic cross-sectional view of a configuration of a polarized light emitting device according to an embodiment.

FIG. 3 is a schematic cross-sectional view of a configuration of a polarized light emitting device according to an embodiment. The polarized light emitting device 20 shown in FIG. 3 includes the same configuration as the polarized light emitting device 10 shown in FIG. 1, and in addition, further includes a polarization conversion layer 16 disposed on the upper surface of the second reflective layer 15, that is, the light emitting surface of the second reflective layer 15. The polarization conversion layer 16 serves to convert the polarization state of the incident light by delaying the phase of the incident light. For example, the polarization conversion layer 16 may delay the phase of the incident light by ¼ wavelength of the wavelength of the incident light. The polarization conversion layer 16 may be formed by patterning a dielectric material having a relatively high refractive index into a nanoscale grating structure smaller than a wavelength of light. For example, the polarization conversion layer 16 may be formed of a meta structure made of Si, $TiO_2$, or $Si_2N_3$.

When the phase of the incident light is delayed by ¼ of the wavelength of the incident light by the polarization conversion layer 16, the linearly polarized component of incident light is changed to a circularly polarized component, and the circularly polarized component is changed to a linearly polarized component. In other words, the polarization conversion layer 16 may serve to convert linearly polarized light into circularly polarized light and convert circularly polarized light into linearly polarized light. For example, a first linearly polarized light component is changed to first circularly polarized light component by the polarization conversion layer 16, and a second linearly polarized component perpendicular to the first linearly polarized component is converted into a second circularly polarized component rotated in a direction opposite to the first circularly polarized component by the polarization conversion layer 16.

Accordingly, the polarized light emitting device 10 illustrated in FIG. 1 emits light having a linearly polarized component, and the polarized light emitting device 20 illustrated in FIG. 3 may emit light having a circularly polarized component. Since the polarized light emitting devices 10 and 20 according to the disclosed embodiment include a structure-based linear polarizer layer 13 and/or polarization conversion layer 16 rather than a material-base, they may be easily manufactured through a conventional semiconductor manufacturing process. In addition, since the linear polarizer layer 13 and the polarization conversion layer 16 can be formed very thin with a thickness of several hundred nm, the polarized light emitting devices 10 and 20 can be miniaturized.

Figure 4:
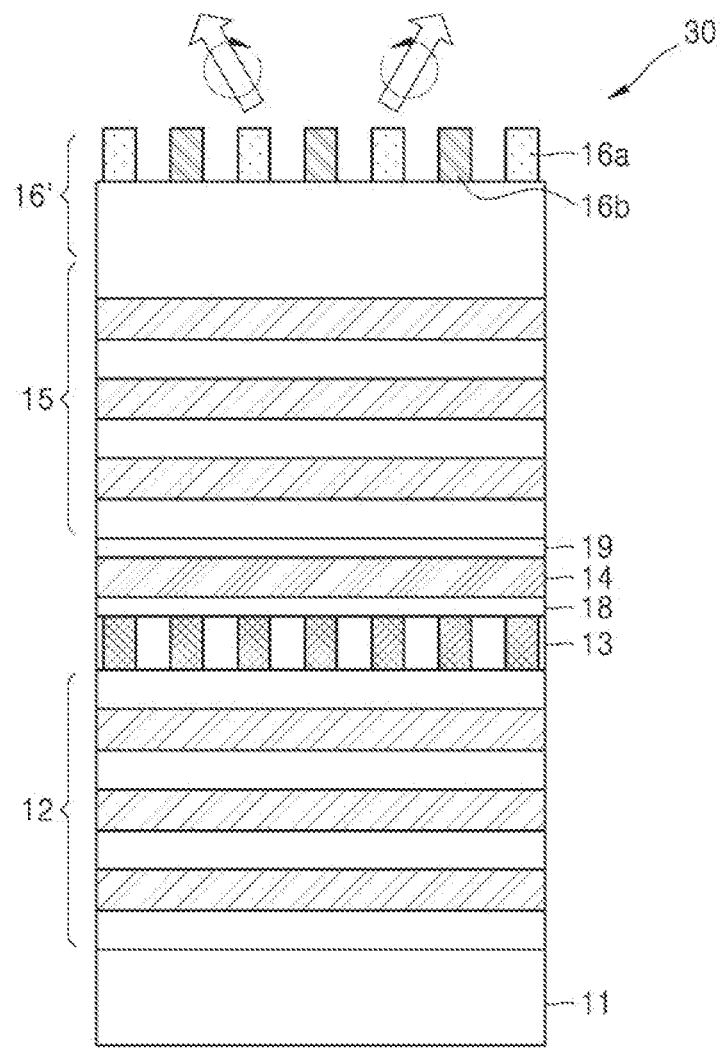
FIG. 4 is a schematic cross-sectional view of a configuration of a polarized light emitting device according to an embodiment.

FIG. 4 is a schematic cross-sectional view of a configuration of a polarized light emitting device according to an embodiment. The configuration of the polarized light emitting device 30 illustrated in FIG. 4 is different from the configuration of the polarized light emitting device 20 illustrated in FIG. 3, only in the polarization conversion layer 16'. In the polarized light emitting device 30 shown in FIG. 4, the polarization conversion layer 16' may include different first polarization conversion layers 16a and second polarization conversion layers 16b disposed together on the upper surface of the second reflective layer 15. The first polarization conversion layer 16a and the second polarization conversion layer 16b are formed in a meta structure patterned with a nanoscale grating structure smaller than the wavelength of light generated from the gain medium layer 14, and the grating structure of the first polarization conversion layer 16a and the grating structure of the second polarization conversion layer 16b may be alternately arranged with each other or overlapped with each other.

The first polarization conversion layer 16a and the second polarization conversion layer 16b may generate light having circularly polarized light components in opposite directions. For example, the first polarization conversion layer 16a may delay the phase of incident light having the first linearly polarized light component by ¼ wavelength to generate light of the first circularly polarized light component, and the second polarization conversion layer 16b may delay the phase of incident light having the first linearly polarized light component by ¾ wavelength to generate light of the second circularly polarized light component rotated in a direction opposite to the first circularly polarized light component. In addition, in order to separate the light of the first circularly polarized component and the light of the second circularly polarized component, the first polarization conversion layer 16a and the second polarization conversion layer 16b may be configured to change the traveling directions of incident light to different directions from each other.

Figure 5:
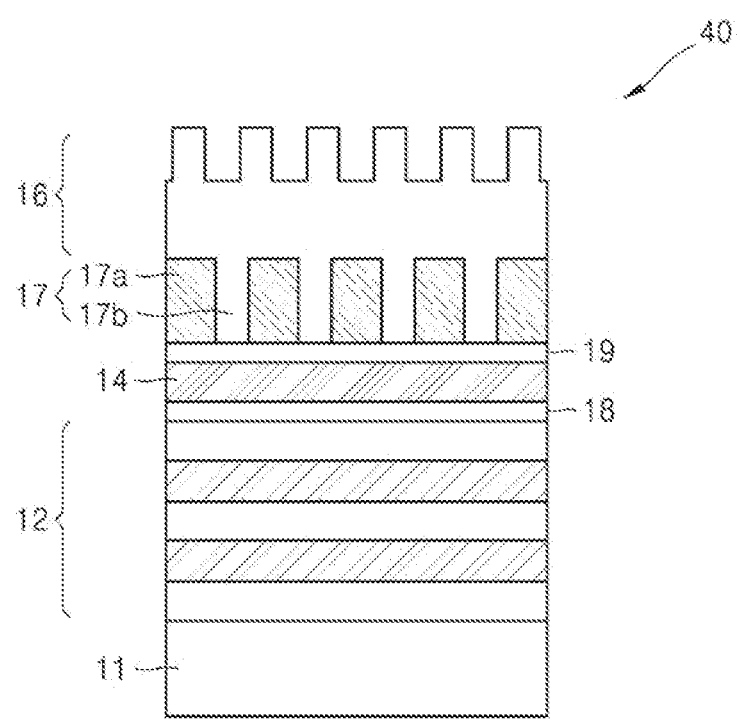
FIG. 5 is a schematic cross-sectional view of a configuration of a polarized light emitting device according to an embodiment.

FIG. 5 is a schematic cross-sectional view of a configuration of a polarized light emitting device according to an embodiment. Referring to FIG. 5, the polarized light emitting device 40 may include a substrate 11, a first reflective layer 12 disposed on the substrate 11, a first electrode 18 disposed on the first reflective layer 12, a gain medium layer 14 disposed on the first electrode 18, a second electrode 19 disposed on the gain medium layer 14, a reflective polarizer layer 17 disposed on the second electrode 19, and a polarization conversion layer 16 disposed on the reflective polarizer layer 17.

The reflective polarizer layer 17 may be configured to perform the role of the linear polarizer layer 13 and the second reflective layer 15 together. For example, the reflective polarizer layer 17 may be configured to have a high reflectivity for light having a linearly polarized component in a predetermined direction. In this case, only light having the linearly polarized component in the predetermined direction may resonate in a resonator formed between the reflective polarizer layer 17 and the first reflective layer 12. For this reason, the reflective polarizer layer 17 may be formed as a meta structure having polarization-dependent properties including a plurality of first grating elements 17a and a plurality of second grating elements 17b alternately arranged in a horizontal direction perpendicular to the thickness direction of the polarized light emitting device 40 as shown in FIG. 5.

The plurality of first grating elements 17a and the plurality of second grating elements 17b may be made of dielectric materials having different refractive indices. In other words, each of the first grating elements 17a may be made of a first dielectric material having a first refractive index, and each second grating element 17b may be made of a second dielectric material having a second refractive index different from the first refractive index. In addition, the first dielectric material and the second dielectric material may be transparent to light generated by the gain medium layer 14. For example, the first grating element 17a and the second grating element 17b may be made of two different dielectric materials selected from Si, $TiO_2$, $SiO_2$, and $Si_2N_3$. In addition to the example materials above, the first dielectric material and the second dielectric material constituting the first grating element 17a and the second grating element 17b may include any other material that is transparent to light in the emission wavelength band of the polarized light emitting device 40.

Figure 6:
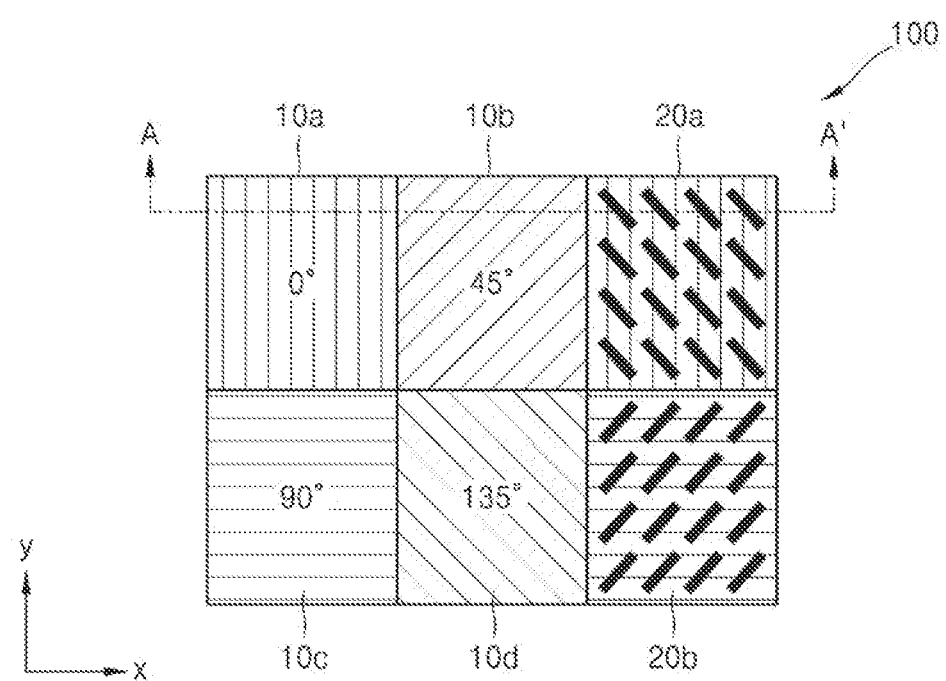
FIG. 6 shows an example arrangement of a plurality of polarized light emitting devices in a light emitting device array according to an embodiment.

When using an array of these polarized light emitting devices, light with any desired polarization component can be generated. FIG. 6 shows an example arrangement of a plurality of polarized light emitting devices in a light emitting device array according to an embodiment. Referring to FIG. 6, the light emitting device array 100 may include a plurality of polarized light emitting devices 10a, 10b, 10c, 10d, 20a, and 20b arranged in two dimensions. For example, the light emitting device array 100 may include first to sixth polarized light emitting devices 10a, 10b, 10c, 10d, 20a, and 20b arranged in a 2×3 array.

The first to fourth polarized light emitting devices 10a, 10b, 10c, and 10d may be configured to emit light having linearly polarized light components in different directions. For example, the first polarized light emitting device 10a may be configured to emit light having a first linearly polarized component. The second polarized light emitting device 10b may be configured to emit light having a second linearly polarized component inclined by 45 degrees to the first linearly polarized component. The third polarized light emitting device 10c may be configured to emit light having a third linearly polarized component perpendicular to the first linearly polarized component. Further, the fourth polarized light emitting device 10d may be configured to emit light having a fourth linearly polarized component inclined by 135 degrees with respect to the first linearly polarized component. For this reason, the first to fourth polarized light emitting devices 10a, 10b, 10c, and 10d may include linear polarizer layers 13 that are rotated and disposed in different directions with respect to each other.

The fifth polarized light emitting device 20a is configured to emit light having a first circularly polarized light component, and the sixth polarized light emitting device 20b is configured to emit light having a second circularly polarized component rotated in a direction opposite to the first circularly polarized component. For this reason, the fifth and sixth polarized light emitting devices 20a and 20b may include a linear polarizer layer 13 rotated by 90 degrees with respect to each other, and may also include a polarization conversion layer 16 as shown, for example, in FIGS. 3-5.

Figure 7:
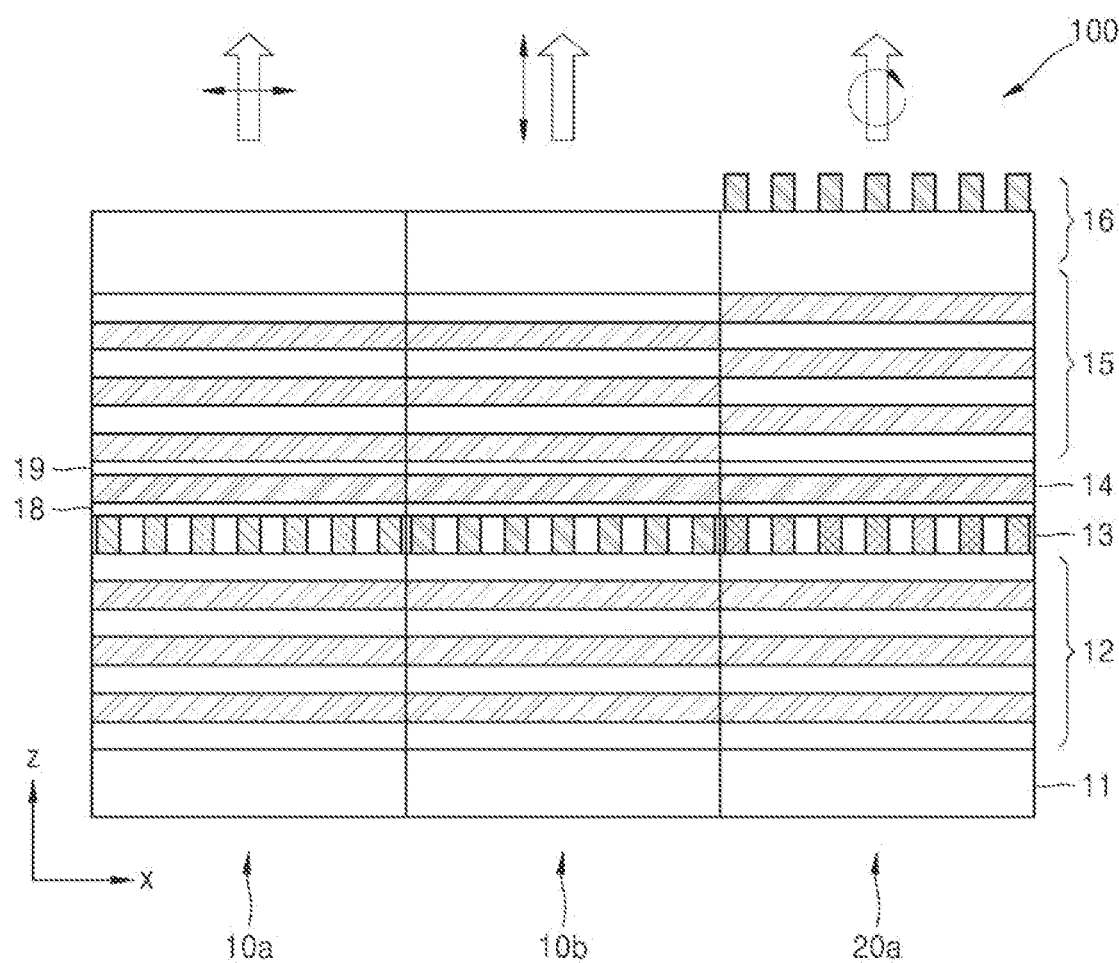
FIG. 7 is a cross-sectional view schematically showing a part of the configuration of the light emitting device array shown in FIG. 6 according to an embodiment.

FIG. 7 is a schematic cross-sectional view showing a partial configuration of the light emitting device array 100 shown in FIG. 6, and particularly, shows a cross-sectional view taken along line AA' of FIG. 6. Referring to FIG. 7, each of the first to fourth polarized light emitting devices 10a, 10b, 10c, and 10d may have the same structure as the polarized light emitting device 10 shown in FIG. 1, for example. In other words, each of the first to fourth polarized light emitting devices 10a, 10b, 10c, and 10d may include a substrate 11, a first reflective layer 12, a linear polarizer layer 13, a first electrode 18, a gain medium layer 14, a second electrode 19, and a second reflective layer 15. In the first to fourth polarized light emitting devices 10a, 10b, 10c, and 10d, the substrate 11, the first reflective layer 12, the first electrode 18, the gain medium layer 14, the second electrode 19, and the second reflective layer 15 can be extended integrally with each other as a common configuration.

In order to allow the first to fourth polarized light emitting devices 10a, 10b, 10c, and 10d to emit light of different linearly polarized components, in the first to fourth polarized light emitting devices 10a, 10b, 10c, and 10d, a plurality of first and second grating elements 13a and 13b of the linear polarizer layers 13 may be arranged along different directions. For example, the first and second grating elements 13a and 13b of the linear polarizer layer 13 of the second polarized light emitting device 10b may be arranged rotated 45 degrees on a horizontal plane with respect to the first and second grating elements 13a and 13b of the linear polarizer layer 13 of the first polarized light emitting device 10a. In addition, the first and second grating elements 13a and 13b of the third polarized light emitting device 10c may be arranged rotated 90 degrees on a horizontal plane with respect to the first and second grating elements 13a and 13b of the first polarized light emitting device 10a. In addition, the first and second grating elements 13a and 13b of the fourth polarized light emitting device 10d may be arranged rotated 135 degrees on a horizontal plane with respect to the first and second grating elements 13a and 13b of the first polarized light emitting device 10a.

Further, the fifth and sixth polarized light emitting devices 20a and 20b may have the same structure as the polarized light emitting device 20 shown in FIG. 3. For example, each of the fifth and sixth polarized light emitting devices 20a and 20b may include a substrate 11, a first reflective layer 12, a linear polarizer layer 13, a first electrode 18, a gain medium layer 14, a second electrode 19, a second reflective layer 15, and a polarization conversion layer 16. The substrate 11, the first reflective layer 12, the first electrode 18, the gain medium layer 14, the second electrode 19, and the second reflective layer 15 of the fifth and sixth polarized light emitting devices 20a and 20b and the substrate 11, the first reflective layer 12, the first electrode 18, the gain medium layer 14, the second electrode 19, and the second reflective layer 15 of the first to fourth polarized light emitting devices 10a, 10b, 10c, and 10d can be extended integrally with each other as a common configuration.

The first and second grating elements 13a and 13b of the linear polarizer layer 13 of the fifth polarized light emitting device 20a may be arranged in parallel with the first and second grating elements 13a and 13b of the linear polarizer layer 13 of the first polarized light emitting device 10a. On the other hand, the first and second grating elements 13a and 13b of the linear polarizer layer 13 of the sixth polarized light emitting device 20b may be arranged perpendicular to the first and second grating elements 13a and 13b of the linear polarizer layer 13 of the first polarized light emitting device 10a. Accordingly, the first and second grating elements 13a and 13b of the linear polarizer layer 13 of the sixth polarized light emitting device 20b are arranged parallel to the first and second grating elements 13a and 13b of the linear polarizer layer 13 of the third polarized light emitting device 10c. Then, the light emitted from the fifth polarized light emitting device 20a and the light emitted from the sixth polarized light emitting device 20b have circularly polarized light components rotated in opposite directions to each other.

In the light emitting device array 100 having the configuration shown in FIGS. 6 and 7, on/off of the first to sixth polarized light emitting devices 10a, 10b, 10c, 10d, 20a, and 20b, and intensities of light emitted from the first to sixth polarized light emitting devices 10a, 10b, 10c, 10d, 20a, and 20b may be independently controlled. Then, the polarization state of light emitted from the light emitting device array 100 may be controlled. For example, it is possible to control the types of polarization such as linear polarization, circular polarization, and elliptic polarization, the direction of the linearly polarized light component in the case of linearly polarized light, whether it is left circular polarization or right circular polarization in the case of circular polarization, and the direction of the elliptical polarization in the case of elliptical polarization. FIGS. 6 and 7 illustrate that the polarized light emitting devices 10 and 20 shown in FIGS. 1 and 3 are used, but are not limited thereto. For example, the light emitting device array 100 may include the polarized light emitting device 30 shown in FIG. 4 or the polarized light emitting device 40 shown in FIG. 5. A miniaturized polarization analysis apparatus or polarization spectral analysis apparatus may be provided by using the light emitting device array 100 with a polarization sensor or a polarization spectral sensor.

Figure 8:
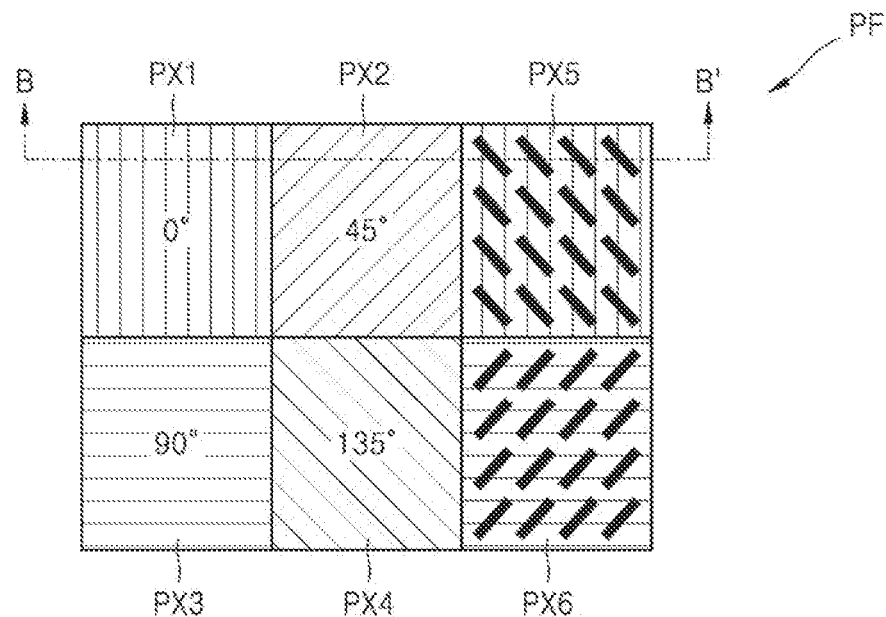
FIG. 8 shows an example arrangement of a plurality of polarization filters in a polarization filter array according to a polarization sensor according to an embodiment.
Figure 9:
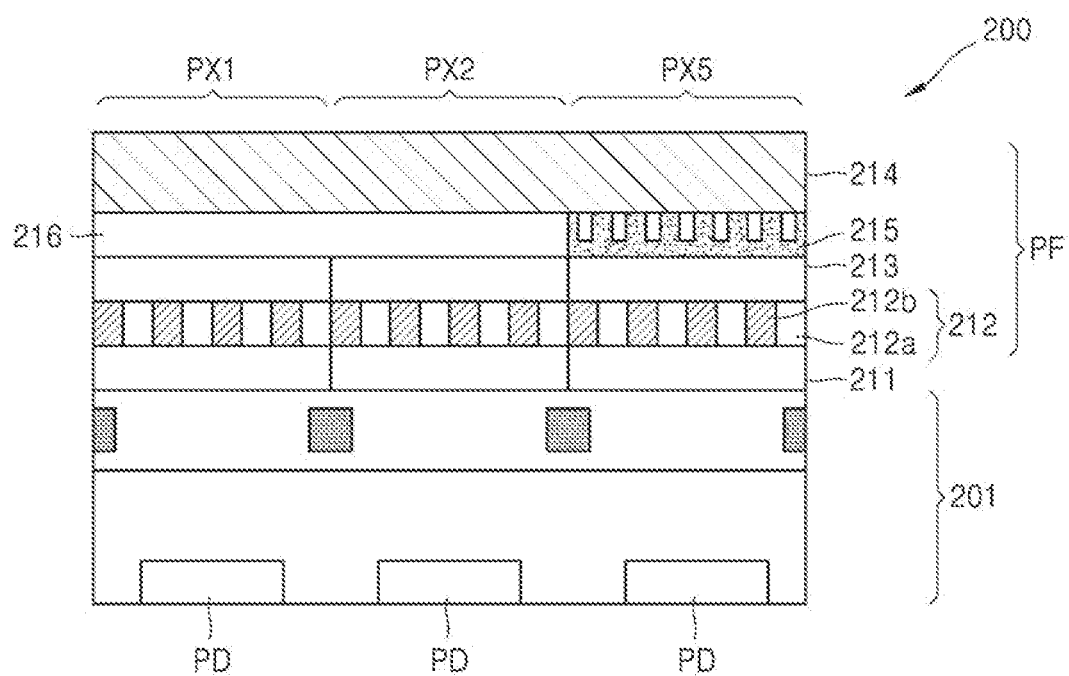
FIG. 9 is a cross-sectional view schematically showing a partial configuration of a polarization sensor including an image sensor and a polarization filter array shown in FIG. 8 according to an embodiment.

FIG. 8 illustrates an arrangement of a plurality of polarization filters in a polarization filter array of a polarization sensor according to an embodiment, and FIG. 9 is a cross-sectional view schematically showing a configuration of a polarization sensor including an image sensor and a polarization filter array illustrated in FIG. 8, and particularly, shows a cross-sectional view taken along line B-B' of FIG. 8.

First, referring to FIG. 8, the polarization filter array PF may include first to sixth polarization filters PX1, PX2, PX3, PX4, PX5, and PX6 arranged in a 2×3 array. The first to fourth polarization filters PX1, PX2, PX3, and PX4 may be configured to transmit light having linearly polarized components in different directions. For example, the first polarization filter PX1 may be configured to transmit light having a first linearly polarized component. The second polarization filter PX2 may be configured to transmit light having a second linearly polarized component inclined at 45 degrees with respect to the first linearly polarized component. The third polarization filter PX3 may be configured to transmit light having a third linearly polarized component perpendicular to the first linearly polarized component. Also, the fourth polarization filter PX4 may be configured to transmit light having a fourth linearly polarized component inclined at 135 degrees with respect to the first linearly polarized component. In addition, the fifth polarization filter PX5 is configured to transmit light having a first circularly polarized light component, and the sixth polarization filter PX6 is configured to transmit light having a second circularly polarized light component rotated in a direction opposite to the first circularly polarized light component.

Referring to FIG. 9, the polarization sensor 200 may include an image sensor 201 and a polarization filter array PF disposed on the image sensor 201. The first to sixth polarization filters PX1, PX2, PX3, PX4, PX5, and PX6 of the polarization filter array PF may include a first reflective layer 211, a linear polarizer layer 212, a second reflective layer 213, and a band pass filter 214. In addition, the fifth polarization filter PX5 and the sixth polarization filter PX6 may further include a polarization conversion layer 215 disposed between the second reflective layer 213 and the band pass filter 214. In the first to sixth polarization filters PX1, PX2, PX3, PX4, PX5, and PX6, the first reflective layer 211, the second reflective layer 213, and the band pass filter 214 can be extended integrally with each other as a common configuration. In addition, the first to fourth polarization filters PX1, PX2, PX3, and PX4 may further include a spacer 216 disposed on the second reflective layer 213 in order to maintain a constant thickness direction position of the band pass filter 214. The thickness of the spacer 216 may be the same as the thickness of the polarization conversion layer 215.

The linear polarizer layer 212 shown in FIG. 9 may have the same structure and function as the linear polarizer layer 13 described above, and the polarization conversion layer 215 may have the same structure and function as the polarization conversion layer 16 described above. In addition, the linear polarizer layers 212 of the first to sixth polarization filters PX1, PX2, PX3, PX4, PX5, and PX6 may be arranged to be rotated with respect to each other as described with reference to FIG. 6.

The polarization sensor 200 may accurately detect the polarization state of incident light. For example, the polarization sensor 200 may detect a ratio of the linearly polarized light components included in incident light for each direction, and in addition, detect a ratio of the left circularly polarized component and a ratio of the right circularly polarized component included in the incident light.

Figure 10:
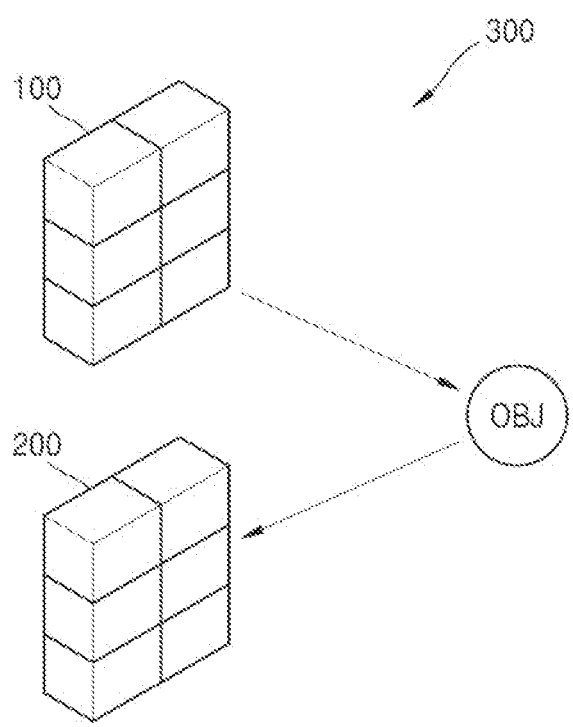
FIG. 10 shows a polarization analysis apparatus including a light emitting device array and a polarization sensor according to an embodiment.

FIG. 10 shows a polarization analysis apparatus according to an embodiment including a light emitting device array 100 and a polarization sensor 200. Referring to FIG. 10, the polarization analysis apparatus 300 may include the light emitting device array 100 shown in FIGS. 6 and 7 and the polarization sensor 200 shown in FIGS. 8 and 9. The light emitting device array 100 may irradiate light having various polarization components onto an external object OBJ. The polarization sensor 200 may analyze a polarization component of light reflected from the object OBJ. Accordingly, the polarization analysis apparatus 300 may analyze various characteristics of the object OBJ by comparing the polarization component of light emitted from the light emitting device array 100 and the polarization component of light reflected from the object OBJ.

For example, information on a material and a surface state of the object OBJ may be obtained using the polarization analysis apparatus 300. In addition, the polarization analysis apparatus 300 may also be applied to LiDAR. For example, by using the polarization analysis apparatus 300, it is possible to find out the polarization component of light having the highest reflectivity of the object in front. Thereafter, by using the light emitting device array 100 to emit light having a polarization component with the highest reflectivity for the object in front, the object in front can be efficiently detected.

In addition, the light emitting device array 100 may emit only light of a predetermined wavelength depending on the configuration of the gain medium layer 14, the configuration of the first and second reflective layers 12 and 15, the configuration of the linear polarizer layer 13, and the configuration of the polarization conversion layer 16. The polarization sensor 200 may also detect only light of a predetermined wavelength according to the configuration of the first and second reflective layers 211 and 213, the configuration of the linear polarizer layer 212, the polarization conversion layer 215, and the configuration of the band pass filter 214. Accordingly, a polarization spectral analysis apparatus may be configured using a plurality of light emitting device arrays 100 that emit light of different wavelengths and a plurality of polarization sensors 200 that detect light of different wavelengths.

Figure 11:
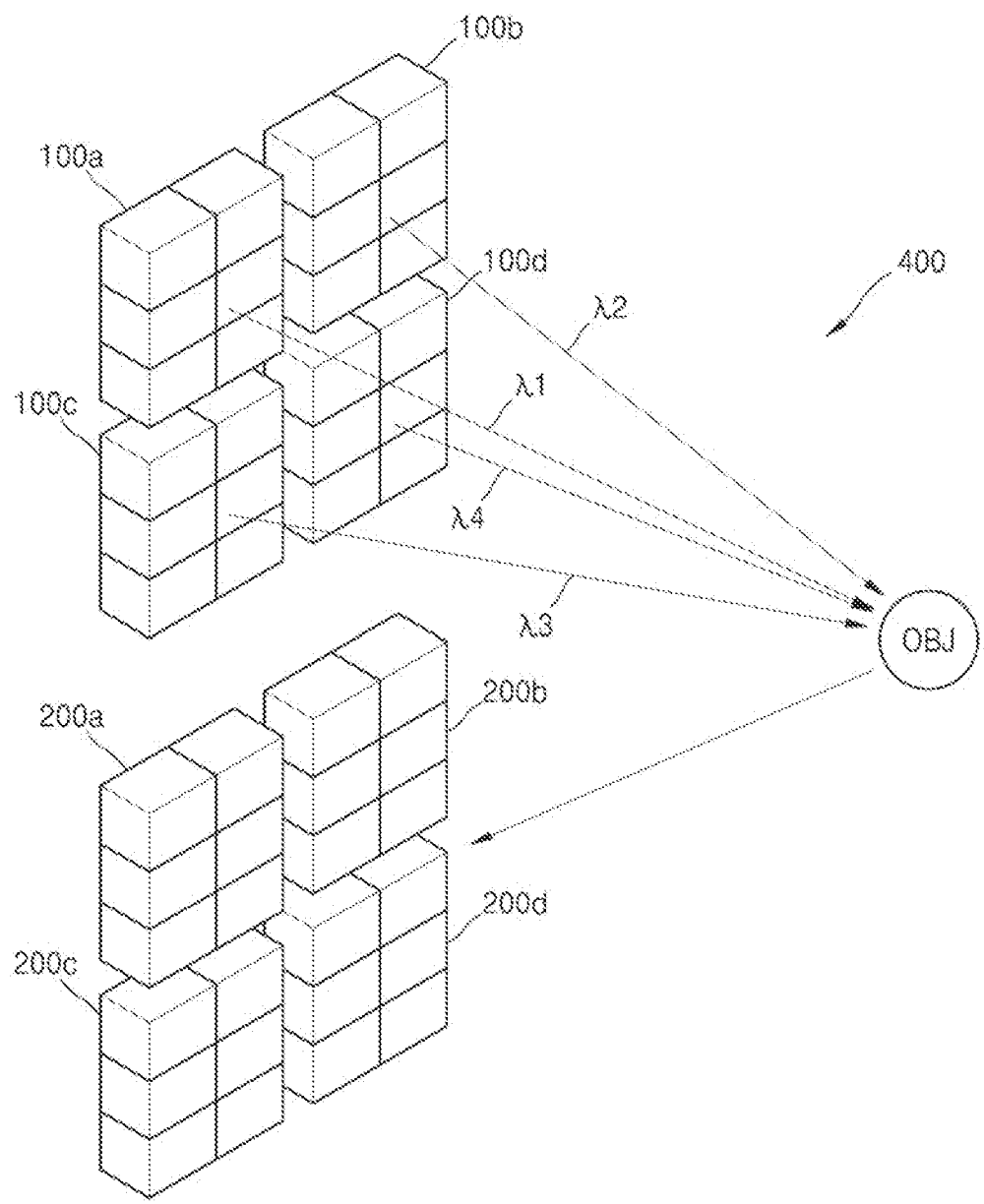
FIG. 11 shows a polarization spectral analysis apparatus including a plurality of light emitting device arrays and a plurality of polarization sensors according to an embodiment.

For example, FIG. 11 shows a polarization spectral analysis apparatus according to an embodiment including a plurality of light emitting device arrays and a plurality of polarization sensors. Referring to FIG. 11, the polarization spectral analysis apparatus 400 may include a plurality of light emitting device arrays 100a, 100b, 100c, and 100d and a plurality of polarization sensors 200a, 200b, 200c, and 200d. The plurality of light emitting device arrays 100a, 100b, 100c, and 100d may emit a plurality of light having different wavelengths λ1, λ2, λ3, and λ4. The plurality of polarization sensors 200a, 200b, 200c, and 200d may detect polarization components of a plurality of light having different wavelengths λ1, λ2, λ3, and λ4, respectively.

Although the above-described polarized light emitting device and a polarization analysis apparatus including the same have been described with reference to embodiments shown in the drawings, these are only examples, and those of ordinary skill in the art will understand that various modifications and equivalent other embodiments are possible therefrom. Therefore, the disclosed embodiments should be considered from an illustrative point of view rather than a limiting point of view. The scope of the rights is indicated in the claims rather than the above description, and all differences within the scope of the same should be interpreted as being included in the scope of the rights.

Since the polarized light emitting device according to the disclosed embodiment includes a structure-based linear polarizer layer and polarization conversion layer rather than a material-base, they may be easily manufactured through a conventional semiconductor manufacturing process. In addition, since the linear polarizer layer and the polarization conversion layer can be formed very thin with a thickness of several hundred nm, the polarized light emitting device can be miniaturized.

In addition, the polarized light emitting device according to the disclosed embodiment may provide a miniaturized polarization analysis apparatus or polarization spectral analysis apparatus used together with a polarization sensor or a polarization spectral sensor.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A polarized light emitting device comprising:
   a first reflective layer and a second reflective layer disposed to face each other in a first direction;
   a gain medium layer between the first reflective layer and the second reflective layer, the gain medium layer being configured to generate light;
   a first electrode electrically connected to an upper surface of the gain medium layer;
   a second electrode electrically connected to a lower surface of the gain medium layer; and
   a linear polarizer layer between the first reflective layer and the first electrode,
   wherein the linear polarizer layer comprises a plurality of first grating elements alternately arranged with a plurality of second grating elements along a second direction perpendicular to the first direction,
   wherein each first grating element of the plurality of first grating elements comprises a first dielectric material having a first refractive index, and
   each second grating element of the plurality of second grating elements comprises a second dielectric material having a second refractive index different from the first refractive index.

2. The polarized light emitting device of claim 1, wherein each first grating element of the plurality of first grating elements and each second grating element of the plurality of second grating elements has a rod shape, and
   wherein the plurality of first grating elements and the plurality of second grating elements are arranged one-dimensionally.

3. The polarized light emitting device of claim 1, wherein a first surface of the plurality of first grating elements and a first surface of the plurality of second grating elements contact the first reflective layer, and
   wherein a second surface of the first grating element opposite the first surface of the plurality of first grating elements and a second surface of the second grating element opposite the first surface of the plurality of second grating elements contact the first electrode.

4. The polarized light emitting device of claim 3, wherein a thickness of each first grating element of the plurality of first grating elements and each second grating element of the plurality of second grating elements is about 90 nm to about 350 nm.

5. The polarized light emitting device of claim 3, wherein an arrangement period of the plurality of first grating elements and the plurality of second grating elements is about 150 nm to about 300 nm.

6. The polarized light emitting device of claim 3,
   wherein each first grating element of the plurality of first grating elements has a first width in the second direction and each second grating element of the plurality of second grating elements has a second width in the second direction, and
   wherein a ratio of the first width to the second width is about 0.2 to about 0.7.

7. The polarized light emitting device of claim 1, wherein the first electrode and the second electrode comprise a transparent conductive material so that light generated from the gain medium layer passes through the first electrode and the second electrode.

8. The polarized light emitting device of claim 1, wherein the first dielectric material and the second dielectric material comprise a material transparent to light generated by the gain medium layer.

9. The polarized light emitting device of claim 1, further comprising a polarization conversion layer disposed on a light emitting surface of the second reflective layer, the polarization conversion layer being configured to convert a polarization state of incident light by delaying a phase of the incident light.

10. The polarized light emitting device of claim 9, wherein the polarization conversion layer comprises a grating structure patterned with a nanoscale pattern smaller than a wavelength of the light generated from the gain medium layer.

11. The polarized light emitting device of claim 9, wherein the polarization conversion layer comprises a first polarization conversion layer delaying the phase of the incident light by ¼ wavelength; and a second polarization conversion layer delaying the phase of the incident light by ¾ wavelength.

12. The polarized light emitting device of claim 11, wherein the first polarization conversion layer is configured to change a traveling direction of the incident light into a first traveling direction and the second polarization conversion layer is configured to change the traveling direction of the incident light into a second traveling direction different from the first traveling direction.

* * * * *